(12) United States Patent
Webster

(10) Patent No.: US 6,758,669 B2
(45) Date of Patent: Jul. 6, 2004

(54) VARIABLE SURFACE HOT PLATE FOR IMPROVED BAKE UNIFORMITY OF SUBSTRATES

(75) Inventor: Michael David Webster, Poughkeepsie, NY (US)

(73) Assignee: Schott Lithotec AG, Jenna (DE)

( * ) Notice: Subject to any disclaimer, the term of this patent is extended or adjusted under 35 U.S.C. 154(b) by 0 days.

(21) Appl. No.: 10/073,711

(22) Filed: Feb. 11, 2002

(65) Prior Publication Data

US 2002/0092843 A1 Jul. 18, 2002

Related U.S. Application Data

(62) Division of application No. 09/990,791, filed on Nov. 16, 2001, now Pat. No. 6,576,572.
(60) Provisional application No. 60/259,403, filed on Dec. 28, 2000, now abandoned.

(51) Int. Cl.[7] ............................................. F27D 5/00
(52) U.S. Cl. ................................. 432/258; 219/444.1
(58) Field of Search .......................... 432/81, 253, 252; 211/41.18; 219/444.1; 392/418; 118/724, 725

(56) References Cited

U.S. PATENT DOCUMENTS

| | | | |
|---|---|---|---|
| 3,895,218 A | 7/1975 | Cooke | 219/543 |
| 4,016,645 A | 4/1977 | Cooke | 29/611 |
| 4,137,447 A | 1/1979 | Boaz | 219/522 |
| 4,208,574 A | 6/1980 | Schäfer | 219/539 |
| 4,398,593 A | 8/1983 | Casinelli | 165/104.11 |
| 4,450,346 A | 5/1984 | Boaz | 219/522 |
| 4,922,728 A | 5/1990 | Backus | 62/278 |
| 5,123,228 A | 6/1992 | Bonkowski et al. | 53/398 |
| 5,343,012 A * | 8/1994 | Hardy et al. | 118/725 |
| 5,462,603 A * | 10/1995 | Murakami | 118/719 |
| 5,534,901 A | 7/1996 | Drake | 347/63 |
| 5,587,019 A | 12/1996 | Fujie | 118/725 |
| 5,590,239 A | 12/1996 | Resnick et al. | 392/418 |
| 5,766,363 A | 6/1998 | Mizuno et al. | 118/725 |
| 5,800,622 A | 9/1998 | Takemi et al. | 118/725 |
| 5,969,537 A | 10/1999 | Kanno et al. | 324/760 |
| 6,652,650 B2 * | 11/2003 | Yang et al. | 117/200 |
| 2002/0026900 A1 | 3/2002 | Huang et al. | 118/730 |

FOREIGN PATENT DOCUMENTS

| | | | | |
|---|---|---|---|---|
| EP | 0 657 918 A2 | 6/1995 | | H01L/21/00 |
| JP | 61288416 | 12/1986 | | H01L/21/205 |
| JP | 62037923 | 2/1987 | | H01L/21/203 |
| JP | 06338450 | 12/1994 | | H01L/21/027 |
| JP | 07058040 | 3/1995 | | H01L/21/205 |
| JP | 09082695 | 3/1997 | | H01L/21/31 |
| JP | 10229114 | 8/1998 | | H01L/21/68 |
| JP | 11-8227 A | 1/1999 | | H01L/21/302 |
| JP | 11208557 | 7/1999 | | G01R/31/26 |
| JP | 2000002114 | 1/2000 | | H01L/21/26 |
| JP | 2000114354 | 4/2000 | | H01L/21/68 |

OTHER PUBLICATIONS

PCT Search Report PCT/US01/48197.

* cited by examiner

Primary Examiner—Gregory Wilson
(74) Attorney, Agent, or Firm—Baker Botts L.L.P.

(57) ABSTRACT

A system, method and apparatus are described for improving critical dimension uniformity in baked substrates. The system, method and apparatus provide for varying the distance between a substrate to be baked and the surface of a hot plate such that an approximately uniform temperature is obtained in the substrate during baking. In one embodiment, the substrate is positioned on a hot plate having a recess generally centered on its top side. The differences in distance between the edges of the substrates contacting the hot plate and the distance between the center region of the substrate and the bottom of the recess enable a generally uniform temperature to be obtained in the substrate.

16 Claims, 3 Drawing Sheets

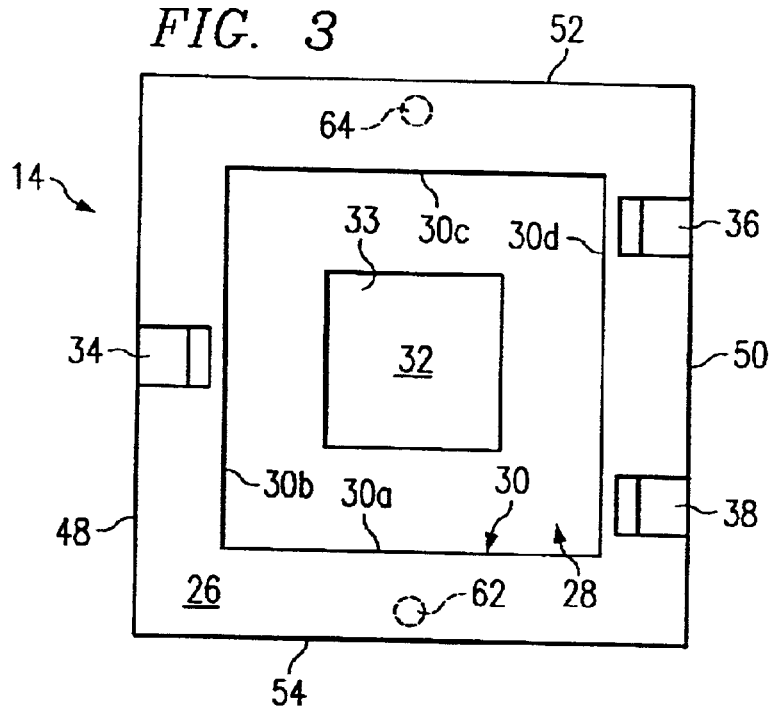
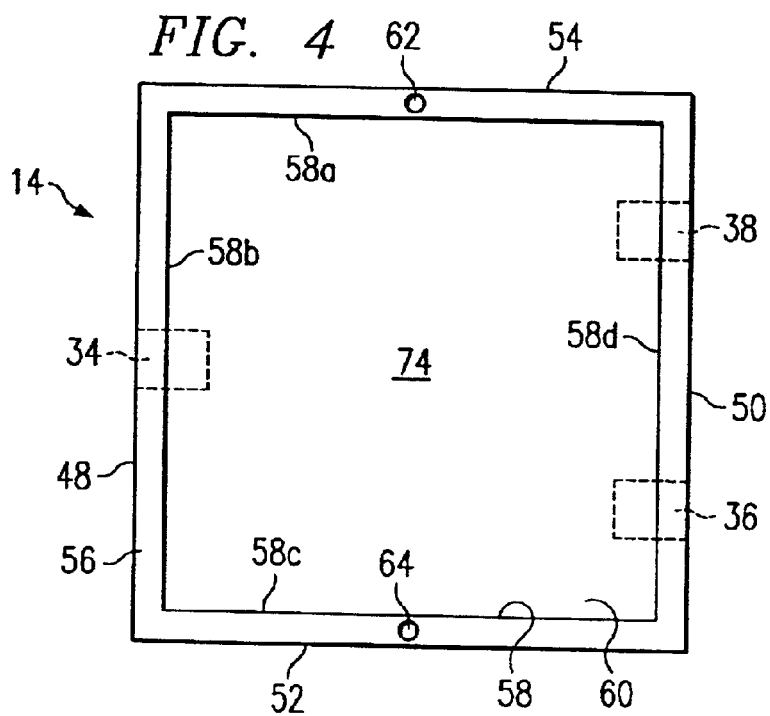

VARIABLE SURFACE HOT PLATE FOR IMPROVED BAKE UNIFORMITY OF SUBSTRATES

CROSS REFERENCE TO RELATED APPLICATION

This is a divisional application of U.S. patent application Ser. No. 09/990,791 filed by Michael David Webster on Nov. 16, 2001 entitled "Variable Surface Hot Plate For Improved Bake Uniformity Of Substrates," now U.S. Pat. No. 6,576,572 which claims priority from U.S. Provisional Patent Application Serial No. 60/259,403 filed Michael David Webster on Dec. 28, 2000 entitled "Variable Surface Hot Plate for Improved Bake Uniformity of Thick Square Substrates", abandoned.

TECHNICAL FIELD

The present invention relates generally to semiconductor fabrication and, more particularly, to an apparatus and method for improving substrate bake uniformity.

BACKGROUND

As semiconductor device manufacturers continue to produce smaller devices, the requirements of photomasks used in the fabrication of these devices continue to tighten. Photomasks, also known as reticles or masks, are typically high-purity quartz or glass plates used to transfer circuit images onto semiconductor wafers such as silicon. As devices have gotten smaller, the circuit images on the mask have become smaller and more complex. Consequently, the quality of the mask has become one of the most crucial elements in establishing a robust and reliable semiconductor fabrication process.

One of the most challenging requirements in producing masks is controlling critical dimension (CD) uniformity. CD uniformity may be defined as the statistical results of measurements of similar sized lines and spaces that are written across a mask. CD uniformity is generally specified as a range, three sigma or both.

Many participants in the electronics industry are driven to reduce CD uniformity error. These participants include manufacturers of lithography tools, processing tools, photoresist, x-ray resist and tools, as well as manufacturers of deep ultra-violet resist and tools, phase shift masks and CD measurement tools.

Efforts to reduce CD uniformity error may also be found in photomask blanks. Blanks typically consist of synthetic quartz substrates coated with chrome and a selected resist. Circuit patterns are typically written directly on blanks in a mask shop.

One of the most common photomask blanks is the 6025-Chrome-895 blank. The 6025 blank is typically a six inch (6.0") square, one quarter inch (0.25") thick, synthetic quartz substrate supplied by Shin Etsu, Asahi and Chi Chi Bu glass manufacturers. Chrome is typically applied to the blank in a manner similar to that described in U.S. Pat. No. 5,230,971. The optical resist that is applied to the substrate may be identified by '895.' This resist is a photo-optical polymer, typically in liquid form, and can be obtained from various suppliers including Arch Chemicals. The resist is typically spin coated onto the chrome/quartz substrate and subsequently baked.

In an effort to understand CD uniformity error in blanks, a study of temperature uniformity across the surface of a baking 6025 blank was performed. The temperature study found the substrate surface to have a seven degree Celsius (7° C.) range. One problem in substrate surface temperature uniformity was determined to be related to the distance between the heated surface used to bake the substrate and the surface of the substrate, also known as the proximity gap.

Previously, controlling the proximity gap was accomplished by stacking layers of thin tape, typically Kapton tape, together to obtain a desired height. The use of tape presents a variety of problems for precise control of proximity gaps. For example, as a thin plastic, the tape is subject to deformation during application. Furthermore, it is common for the tape to thin at baking temperatures over its useful life. In addition, exact placement of the tape is necessary and the tape cannot generally be positioned as accurately as needed.

In addition to problems associated with controlling the proximity gap, a series of problems are associated with typical hot plates commonly used to bake substrates. First, a typical hot plate is made from a block of aluminum. Due to the softness of aluminum, the heated surface or surfaces of an aluminum hot plate can generally not be machined flat below two hundred microns (200 $\mu$m). The softness of aluminum and most frequently used grinding techniques prevent obtaining tighter tolerances for flatness or smoothness. Second, since the substrates typically being heated are round and the hot plate surface is typically square, more heat is commonly absorbed by air surrounding the corners of the hot plate than in the center. This causes a lowering of the temperature at the edges of the substrate which effects CD uniformity in the blank.

In an attempt to overcome these and other disadvantages, hot plates have been designed which use radial heater coils having individual temperature controllers to heat each section of the hot plate. For such an apparatus to be effective, all of the individual temperature controllers must be properly calibrated and working. A failure in a single temperature controller would typically be compensated for by another temperature controller thereby leading to undetectable temperature errors.

SUMMARY

In accordance with teachings of the present disclosure, a method, system and apparatus for improving temperature uniformity in a substrate during baking are provided.

In one aspect, a method for heating a substrate is provided. The method preferably includes maintaining a hot plate having a recess defined by a bottom and at least one wall disposed in its first surface. Further, the method preferably also includes applying heat to a second surface of the hot plate and positioning the substrate above the recess, proximate the first surface of the hot plate, such that respective first and second surfaces of the substrate are maintained generally parallel to the first surface of the hot plate and to the bottom of the recess. Also, an outer edge of the first surface of the substrate is preferably maintained proximate the wall defining the recess.

In another aspect, the method for baking a substrate may include applying heat to a hot plate, positioning a first surface of the substrate a distance from the hot plate and varying the distance between the first surface of the substrate and the hot plate to maintain approximately uniform application of heat to the first surface of the substrate and a more uniform temperature across the first surface of the substrate.

In a further aspect, an apparatus for baking a substrate is provided. The apparatus preferably includes a hot plate having a recess disposed on its first surface. The recess may be defined by at least one wall and preferably has an approximately uniform depth. Further, the recess is preferably sized such that at least a portion of an outer edge of a substrate contacts a portion of the first surface of the plate when the substrate is positioned to cover the recess.

In yet another embodiment, a system for baking a substrate is provided. The system preferably includes a hot plate having a first recess with an approximately uniform depth disposed in a first surface of the hot plate. The recess is preferably defined by a bottom and at least one wall. The hot plate included in the system preferably also includes a second recess having an approximately uniform depth disposed in the second surface of the hot plate. Similar to the first recess, the second recess is preferably defined by a bottom and at least one wall. In part to facilitate baking, the system also preferably includes a heating source preferably coupled to the second recess. In the system, the hot plate is preferably operable to maintain the substrate proximate its first surface such that the first recess is covered and a portion of the substrate's first surface is in contact with the first surface of the hot plate. The hot plate is preferably further operable to establish an approximately uniform temperature in the substrate during baking.

One technical advantage provided by the present invention is a reduction in critical dimension uniformity error due to non-uniform bakes.

An additional technical advantage provided by the present invention is a reduction in backside defects which can occur on blanks due to Kapton tape wear.

A further technical advantage provided by the present invention is an ability to manufacture more critical mask layers with improved blanks.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 3 is a schematic drawing with portions cut away showing a top view of a hot plate incorporating teachings of the present invention;

FIG. 4 is a schematic drawing with portions cut away showing a bottom view of a hot plate incorporating teachings of the present invention;

DETAILED DESCRIPTION

Preferred embodiments of the present invention and its advantages are best understood by referring to FIGS. 1 through 7 of the drawings, like numerals being used for like and corresponding parts of the various drawings.

Figure 1:
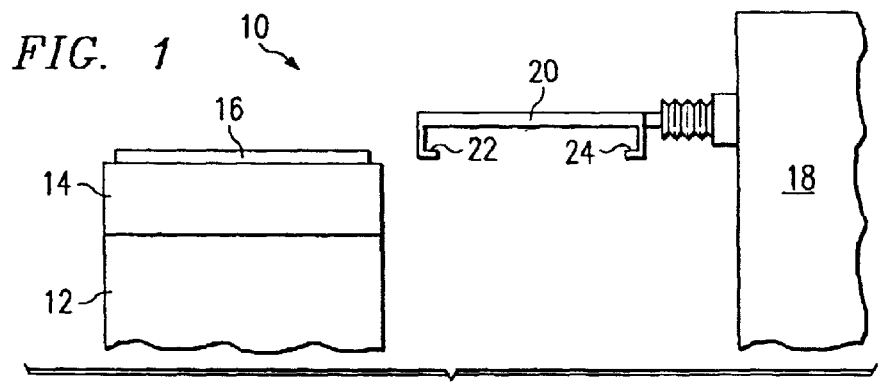
FIG. 1 is a schematic drawing with portions broken away showing a processing system incorporating teachings of the present invention.

FIG. 1 illustrates one embodiment of a processing system, indicated generally at 10, incorporating teachings of the present invention. Heat source 12 is preferably included in system 10 to provide heat to hot plate 14 during baking. Hot plate 14 may be disposed on heat source 12 such that substrate 16, such as a 6025-Chrome-895 photomask blank, a semiconductor substrate (not expressly shown), or other types of substrates may be supported and baked.

During processing, robot mechanism 18 preferably positions substrate 16 on hot plate 14 using robot arm 20. After system 10 has completed baking substrate 16, robot arm 20, preferably using grasping mechanisms 22 and 24, may remove substrate 16 using robot access cutouts (illustrated in FIG. 2). Alternative heating sources, substrates and robot mechanisms may be employed with teachings of the present invention without departing from its spirit and scope.

Figure 2:
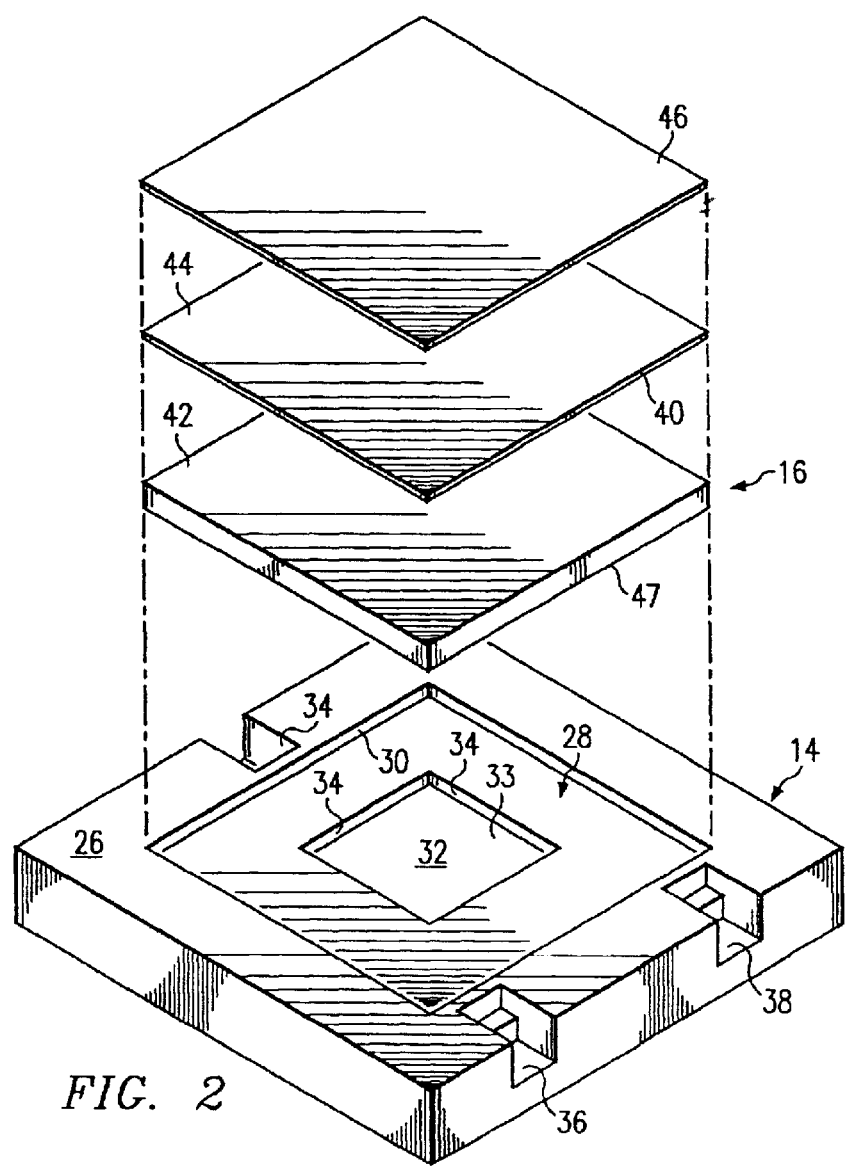
FIG. 2 is a perspective drawing showing one embodiment of a relationship between a hot plate and a substrate assembly according to teachings of the present invention.

Referring now to FIG. 2, a perspective view of a hot plate 14 and substrate 16 assembly is illustrated. According to teachings of the present invention, first surface 26 of hot plate 14 preferably includes recess 28 disposed therein. Recess 28 may be defined by one or more walls 30 and bottom 32.

In alternate embodiments of hot plate 14, recess 28 may be graduated or otherwise varying in depth. As illustrated in FIG. 2, an additional recess 33 may be included within recess 28. Recess 33 is preferably disposed in the center region of bottom 32. Alternative placements, however, are considered within the spirit and scope of the present invention. As discussed in greater detail below, recess 33 may be employed to achieve greater temperature uniformity during baking.

Also preferably included in first surface 26 of hot plate 14 are robot access cutouts 34, 36 and 38. Hot plate 14 is discussed in greater detail below.

During normal processing, substrate 16 preferably includes coating 40, such as chrome, disposed on first surface 42 thereof. Coating 40 may be disposed on surface 42 of substrate 16 using such techniques as sputtering, chemical vapor deposition, spin coating, as well as others. In one embodiment, an antireflective layer (not expressly shown) may be disposed on first surface 44 of coating 40.

Once coating 40 has been disposed on first surface 42 of substrate 16, coating 40 is preferably cleaned and inspected. After cleaning and inspecting coating 40, resist layer 46 is preferably disposed on first surface 44 of coating 40. Resist layer 46 is preferably a liquid polymer.

As illustrated in FIG. 2, substrate 16 preferably rests above recess 28 and recess 33, where included, generally parallel to bottom surface 32, during baking. Also as illustrated, uncoated surface 47 of substrate 16 preferably engages first surface 26 of hot plate 14 during baking. Additional detail regarding the relationship between substrate 16 and hot plate 14 is discussed below.

During baking, heat may be generated by heater 12. Hot plate 14, according to teachings of the present invention, preferably distributes the heat from heat source 12 across uncoated surface 47 of substrate 16 in a generally uniform manner. The heat may then be absorbed by substrate 16, coating layer 40 and finally by resist layer 44. In one embodiment, coating layer 40 and resist layer 16 are less than one micron thick.

FIG. 3 illustrates one embodiment of a hot plate operable to reduce CD (critical dimension) uniformity error typically resulting from non-uniform baking of a substrate, such as substrate 16, according to teachings of the present invention. Hot plate 14 has a generally square configuration as shown in FIG. 3. Depending on the configuration of the substrate 16 being baked and the heat source 12 used for baking, hot plate 14 may have various configurations such as a rectangle, ellipse, circle, etc.

As mentioned above, preferably disposed on first surface 26 of hot plate 14 are robot access cutouts 34, 36 and 38. Robot access cutouts 34, 36 and 38 are preferably found in sides 48 and 50, adjacent sides 52 and 54, and preferably allow a robot mechanism, such as robot mechanism 18, to position the substrate 16 being heated by hot plate 14. Alternate embodiments of hot plate 14 may not include robot access cutouts, may include six (6) robot access cutouts, as well as may be arranged in other configurations.

Also as mentioned above, recess 28, generally defined by one or more walls 30 and bottom 32, is preferably disposed in first surface 26 of hot plate 14. Recess 28, in conjunction with recess 33 when included, is preferably operable to allow a uniform baking temperature to be obtained at a surface of a substrate disposed proximate thereto such that a reduction in CD uniformity error, as well as other benefits, may be achieved. Similar to the design of hot plate 14, recess 28 may take the shape of a circle, ellipse, rectangle, etc. such that recess 28 better coincides with the shape of an associated substrate to be baked according to teachings of the present invention. Forming recess 28 in the shape of a circle or an ellipse are two embodiments in which recess 28 may be defined by a single wall 30. Further, similar to recess 28, recess 33 may be formed from one or more walls 34 and according to the various parameters associated with a substrate to be baked.

Bottom surface 56 of hot plate 14 is generally illustrated in FIG. 4 according to teachings of the present invention. Preferably disposed in bottom 56 and generally defined by one or more walls 58 is recess 60.

Also preferably included on hot plate 14 are positioning apertures 62 and 64. Positioning apertures 62 and 64 are typically accessible via bottom surface 56 and are generally centered along sides 52 and 54 adjacent sides 48 and 50. Positioning apertures 62 and 64 preferably allow a positioning apparatus (not expressly shown) to position hot plate 14 during processing.

Figure 5:
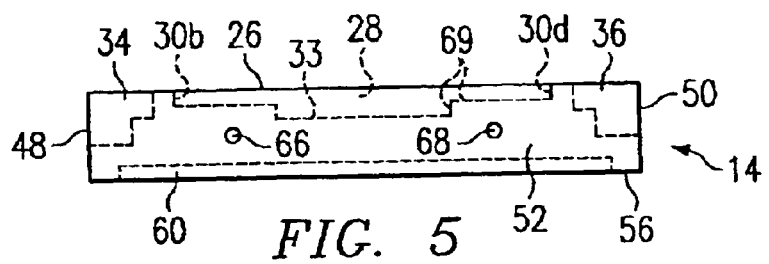
FIG. 5 is a schematic drawing with portions cut away showing a side view of a hot plate incorporating teachings of the present invention.

Side 52 of hot plate 14 is generally illustrated in FIG. 5 according to teachings of the present invention. Preferably disposed on side 52 are maintenance apertures 66 and 68. Maintenance apertures 66 and 68 may be included on hot plate 14 to allow one or more knobs (not expressly shown) to be attached thereto. Such knobs may be employed to aid in the removal of hot plate 14 from heat source 12, typically for maintenance purposes. Devices other than knobs, such as screws (not expressly shown), may also be used to aid in the removal of hot plate 14. Although not expressly shown, one or more apertures similar to maintenance apertures 66 and 68 may also be included on one or more of sides 48, 50 and 54.

FIG. 5 further illustrates recess 28 and recess 33. Together, recess 28 and recess 33 form a single recess with multiple steps 69. Generally, the one or more walls 30 of recess 28 combine with the one or more walls 34 of recess 33 preferably combine to form the multiple steps 69.

Figure 6:
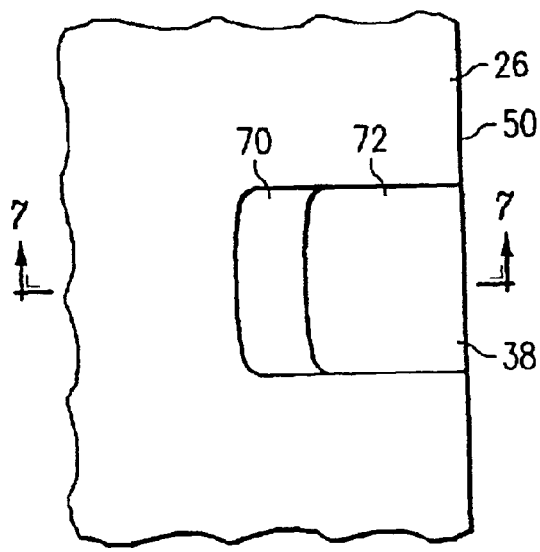
FIG. 6 is a schematic drawing with portions broken away showing a top view of a robot access cutout according to teachings of the present invention.

A top view of robot access cutout 38 according to teachings of the present invention is shown in FIG. 6. As mentioned above, robot access cutouts 34, 36, and 38 are preferably included in hot plate 14 to enable a robot mechanism 18 to position substrate 16 for baking by hot plate 14. In one embodiment, robot access cutout 38, similar to robot access cutouts 34 and 36, has first tier 70 and second tier 72. Other embodiments of robot access cutouts 34, 36 and 38 are considered within the scope of the present invention.

Figure 7:
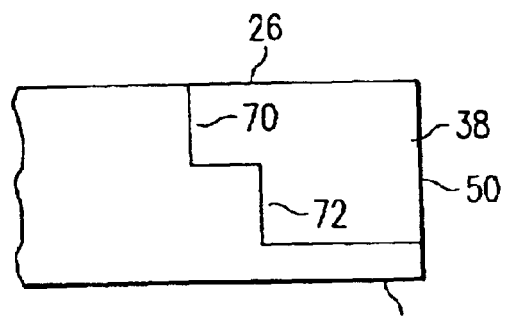
FIG. 7 is a schematic drawing partially in section and with portions broken away showing a side view of the robot access cutout of FIG. 6 according to teachings of the present invention.

A view of robot access cutout 38 taken along line 7—7 of FIG. 6 is shown in FIG. 7. The view in FIG. 7 further illustrates first tier 70 and second tier 72 of robot access cutout 38. As mentioned above, robot access cutouts 34 and 36 are preferably configured similar to robot access cutout 38.

In general, to provide an application of approximately uniform heat across the surface of a substrate during baking, there are many variables that preferably need to be controlled. Typically, the thermal conductivity in each media, the substrate and the hot plate is generally constant. The distance that heat energy must travel through each media will generally determine the uniformity of heat energy at the critical or top surface of the substrate being baked. The distances of primary concern to achieving uniform temperatures in and at the critical surface of the substrate are the thickness of the substrate, the distance from the heating elements contained within the heat source to the top surface of the heat source employed, the distance from the top surface of the heat source to the lower surface of the hot plate, the thickness of the hot plate and the distance from the top surface of the hot plate to the surface of the substrate nearest the hot plate.

According to teachings of the present invention, and as described below, hot plate 14 generally controls the distance from the top surface of heat source 12 to second surface 56 as well as bottom 74 of recess 60. Hot plate 14 also generally controls the thickness of hot plate 14 and the distance from top surface 26 and bottom 32 of recess 28 and recess 33, when included, to surface 47 of substrate 16 in contact with hot plate 14.

Hot plate 14, illustrated in FIGS. 1 through 7, may be used with a 6025-Chrome-895 photomask blank (not expressly shown) or a substrate having similar characteristics. A 6025-Chrome-895 photomask is typically square and measures approximately six inches (6") on its four sides. The thickness of a typical 6025-Chrome-895 photomask blank is approximately one quarter of an inch (0.25"). Hot plate 14 may be designed for use with larger or thicker substrates, blanks, etc., as well as with substrates, blanks, etc., having other shapes.

In the embodiment of hot plate 14 designed for use with a 6025-Chrome-895 photomask blank, sides 48, 50, 52 and 54 are approximately seven and seven tenths inches (7.7") in length. The distance between first surface 26 and second surface 56, the thickness of hot plate 14, is approximately eight tenths of an inch (0.8").

To control the distance between first surface 26 of hot plate 14 and first surface 47 of substrate 16, recess 28 is preferably included in hot plate 14. Recess 28 is generally centered in first surface 26 of hot plate 14 and has four (4) approximately five and eight tenths inch (5.8") walls 30. For purposes of describing various features of the present invention, walls 30 have been designated 30a, 30b, 30c and 30d. Other dimensions or shapes of recess 28 are possible and generally depend on such characteristics as the size and shape of the blank, substrate or other object to be baked, the size and shape of the heat source used, as well as other components used in the baking process.

Recess 28 is preferably machined into surface 26 of hot plate 14. Recess 28, in the embodiment designed for baking a six inch (6.0") square, one quarter of an inch (0.25") thick 6025-Chrome-895 photomask blank, is approximately six thousandths of an inch (0.006") deep. This depth is preferably substantially uniform across the region of recess 28 defined by bottom 32 and walls 30a, 30b, 30c and 30d. Depths of up to eight thousandths of an inch (0.008") have been shown to produce desirable temperature uniformity during baking of a typical photomask blank.

As mentioned above, recess 28 may include multiple steps 69 as formed by recess 33 or other means. By adding recess 33, the distance between surface 47 of substrate 16 and first surface 26 of hot plate 14 may be further controlled. According to teachings of the present invention, recess 33 may be sized to overcome such occurrences as increased heat levels at the center of hot plate 14 as well as to overcome other uniform heating concerns. Recess 33, as mentioned above, may be sized, formed, created or otherwise possess other attributes similar to recess 28.

In one embodiment, hot plate 14 is made from Silica Carbide (SiC). Silica Carbide, or materials having similar characteristics, enables recess 28, recess 33 where included as well as recess 60 to be machined into hot plate 14 within tolerances of two ten thousandths of an inch (0.0002"). However, benefits of teachings of the present invention may be achieved with various materials capable of being machined within tolerances of one one hundredth of an inch (0.01").

One purpose of sizing recess 28 at approximately five and eight tenths inches (5.8") per side, is to allow approximately one tenth of an inch (0.1") of an outer edge of the surface of a 6025-Chrome-895 photomask blank to be in contact with first surface 26 of hot plate 14. Sizing recess 28 such that an outer edge of the surface of a 6025-chrome-895 blank, along its four sides, contacts first surface 26 of hot plate 14 along sides 48, 50, 52 and 54, proximate wall 30, also aids in controlling the distance between first surface 26 of hot plate 14 and the surface of a blank such as second surface 47 of substrate 16. According to teachings of the present invention, for a one quarter of an inch (0.25") thick substrate, such as a 6025-Chrome-895 photomask blank, approximately one tenth of an inch (0.1") of contact between first surface 26 and the surface of a 6025-Chrome-895 photomask blank centered thereon produces desirable temperature uniformity across the surface area of the 6025-Chrome-895 photomask blank.

The thermal conductivity of Silica Carbide is generally much higher than air. Therefore, the heat energy delivered to the outer edge of the second surface 47 of substrate 16 in contact with first surface 26 of hot plate 14 will be much greater than the energy delivered to the center portion of the second surface 47 of substrate 16 positioned over or to cover recess 28 and recess 33 where included. This generally results from the heat having to pass through the air trapped between substrate 16 and bottom 32 before it can enter the center portions of second surface 47 of substrate 16 whereas the outer edges of second surface 47 of substrate 16 are in direct contact with first surface 26 of hot plate 14.

Second surface 56 of hot plate 14 preferably includes recess 60 to enable greater uniformity in the amount of heat transferred from heat source 12 to hot plate 14. This heat transfer uniformity may also reduce hot spots which can occur in existing systems. In one embodiment of hot plate 14, each wall 58a, 58b, 58c and 58d of recess 60 is approximately six and one tenth inches (6.1") in length. Recess 60 preferably has an approximately uniform depth of three thousandths of an inch (0.003"). Bottom 74 of recess 60 is preferably operable to continuously engage the surface of heat source 12 during use to enable more uniform heat transfer from heat source 12 to hot plate 14. As disclosed, recess 60 aids in controlling the distance between the top surface of heat source 12 and second surface 56 of hot plate 14.

The combination of the contact between a portion of substrate 16 and hot plate 14, the depth of recess 28, recess 33 and the uniformity in depth of bottom 74 of recess 60 cooperate to balance the amount of heat transferred to substrate 16 and the heat loss from substrate 16 such that approximate temperature uniformity may be achieved.

As mentioned above, hot plate 14 may be designed for use with substrates, blanks, etc., other than a 6025-Chrome-895 photomask blank. When designing hot plate 14 for use with alternate substrates, blanks, etc., some changes to the embodiment disclosed here may be desired. For example, for thicker substrates, the amount of contact between the substrate and the first surface of the hot plate may need to be increased to account for the losses that occur at the edges of the substrate. Similarly, the amount of contact may need to be reduced for thinner substrates.

Although the present invention has been described with respect to a preferred embodiment thereof, various changes and modifications may be suggested by one skilled in the art. It is intended that the present invention encompass such changes and that any modifications fall within the scope of the appended claims.

What is claimed is:

1. An apparatus for baking a substrate comprising:
   a hot plate having respective first and second surfaces;
   a first recess disposed in the first surface of the hot plate;
   the first recess defined in part by at least one wall and a bottom;
   the first recess having a generally uniform depth defined by the distance between the bottom of the first recess and the first surface of the hot plate;
   the first recess sized such that at least a portion of an outer edge of the substrate contacts at least a portion of the first surface of the hot plate when the substrate is disposed over the first recess;
   a recess disposed proximate a center region of the bottom of the first recess; and
   a second recess disposed in the second surface of the plate, the second recess defined by at least one wall and having an approximately uniform depth.

2. The apparatus of claim 1 further comprising the first recess sized such that approximately one tenth of an inch of the outer edge of the substrate contacts the first surface of the hot plate when the substrate is positioned to cover the first recess.

3. The apparatus of claim 1 further comprising the first recess having a depth between approximately six thousandths of an inch (0.006") to eight thousandths of an inch (0.008").

4. The apparatus of claim 1 further comprising the first recess defined by four walls having approximately equal lengths.

5. The apparatus of claim 1 further comprising the plate made from silicon carbide (SiC).

6. The apparatus of claim 1 further comprising:
   at least one robot access cutout disposed on a first edge of the plate; and
   at least two robot access cutouts disposed on a second edge of the plate opposite the first edge.

7. The apparatus of claim 1 further comprising a heat source operably coupled to the second surface of the plate.

8. The apparatus of claim 1 further comprising:

the recess disposed within the first recess sized such that an approximately uniform temperature is achieved at a first surface of the substrate disposed over the first recess.

9. A system for baking a substrate comprising:

a hot plate having respective first and second surfaces;

a first recess having an approximately uniform depth defined by a bottom and at least one wall disposed in the first surface of the hot plate;

a second recess having an approximately uniform depth defined by a bottom and at least one wall disposed in the second surface of the hot plate;

a heating source operably coupled to the second recess;

the hot plate operable to maintain the substrate proximate the first surface such that the first recess is covered and a portion of a first surface of the substrate is in contact with the first surface of the hot plate proximate the wall defining the first recess; and the hot plate further operable to establish an approximately uniform temperature in the substrate during baking.

10. The system of claim 9 further comprising a robot mechanism operable to position the substrate on the hot plate.

11. The system of claim 9 further comprising:

a recess disposed in the bottom of the first recess; and the recess sized to achieve an approximately uniform temperature in the substrate during baking.

12. An apparatus for baking a substrate comprising:

a hot plate having respective first and second surfaces;

a first recess disposed in the first surface of the hot plate, the first recess defined in part by at least one wall and a bottom;

a second recess disposed in the second surface of the plate opposite the first recess, the second recess defined in part by at least one wall and a bottom;

a heat source operably coupled to the second recess;

the hot plate operable to maintain a first surface of the substrate in contact with the first surface of the hot plate proximate the wall defining the first recess at a selected distance from the bottom of the second recess; and the hot plate further operable to establish an approximately uniform temperature in the substrate during baking.

13. The apparatus of claim 12, further comprising the first recess having a generally uniform depth defined by the distance between the bottom of the first recess and the first surface of the hot plate.

14. The apparatus of claim 12, further comprising:

at least one robot access cutout disposed on a first edge of the plate; and at least two robot access cutouts disposed on a second edge of the plate opposite the first edge.

15. The apparatus of claim 12, further comprising a third recess disposed proximate a center region of the bottom of the first recess and sized such that an approximately uniform temperature is achieved at the first surface of the substrate.

16. The apparatus of claim 12, further comprising the second recess having an approximately uniform depth.

\* \* \* \* \*